(12) United States Patent
Gray, III

(10) Patent No.: US 6,204,679 B1
(45) Date of Patent: Mar. 20, 2001

(54) LOW COST MEMORY TESTER WITH HIGH THROUGHPUT

(75) Inventor: Walter Gray, III, Oakland, CA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 09/186,012

(22) Filed: Nov. 4, 1998

(51) Int. Cl.$^7$ .................................................. G01R 31/02
(52) U.S. Cl. ........................................... 324/760; 324/765
(58) Field of Search ..................................... 324/760, 765, 324/73.1, 158.1; 209/573; 374/57; 73/865.6

(56) References Cited

U.S. PATENT DOCUMENTS

| | | | |
|---|---|---|---|
| 3,039,604 | * | 6/1962 | Bickel et al. ........................ 324/73.1 |
| 3,094,212 | * | 6/1963 | Moore et al. ........................ 324/73.1 |
| 4,379,259 | | 4/1983 | Varadi et al. . |
| 4,729,246 | * | 3/1988 | Melgaard et al. ..................... 374/57 |
| 4,926,118 | * | 5/1990 | O'Connor et al. .................. 73/865.6 |
| 5,184,068 | * | 2/1993 | Twigg et al. ......................... 324/760 |
| 5,537,051 | | 7/1996 | Jalloul et al. . |
| 5,650,732 | | 7/1997 | Sakai . |
| 5,742,168 | | 4/1998 | Kiyokawa et al. . |
| 5,788,084 | | 8/1998 | Onishi et al. . |
| 5,812,409 | | 9/1998 | Kanno et al. . |
| 5,859,540 | | 1/1999 | Fukumoto . |

* cited by examiner

*Primary Examiner*—Ernest Karlsen
(74) *Attorney, Agent, or Firm*—Lance Kreisman

(57) ABSTRACT

An automatic test system for testing semiconductor devices, particularly memory devices. The test system includes a handling device with several temperature controlled chambers, each associated with a test head. Trays of devices are loaded into the handling device and are brought to thermal equilibrium in each chamber before being tested. The number of test sites within each chamber is varied in inverse proportion to the time it takes to test a device at the temperature within the chamber.

10 Claims, 4 Drawing Sheets

LOW COST MEMORY TESTER WITH HIGH THROUGHPUT

FIELD OF THE INVENTION

This invention relates generally to the manufacture of semiconductor components and more specifically to testing of semiconductor components during manufacture.

BACKGROUND OF THE INVENTION

Semiconductor components are tested during the manufacturing process to identify and sort out non-functioning parts. Testing also allows semiconductor components to be sorted based on the performance actually achieved by each part.

In manufacturing semiconductor components, throughput of the manufacturing process is very important. Large capital investment is required to build a manufacturing plant. For such a venture to be profitable, many semiconductor chips must be made at the plant. It is generally desired that the testing operation run with the same throughput as the rest of the manufacturing process.

Testing is usually performed with automated test equipment, such as the J990 family of test systems sold by Teradyne, Inc. The automated test system, or "tester", typically has a main frame and a test head. The test head contains electronic circuitry that generates test signals that are applied to a device under test or compares signals produced by the device under test to expected values. Data for the circuitry in the test head is generally provided from a main frame portion of the tester. The main frame typically contains a pattern generator that sends signals to the test head circuitry specifying the signals to apply to the device under test or that are expected from the device under test. In addition, the main frame includes power supplies and other support circuitry needed by the test system.

The test head contains circuitry to generate and measure test signals for at least one device being tested. The collection of signals that are connected to one device under test is called a "site." To increase throughput, a test head will often contain several sites.

The circuitry that generates and measures test signals for one lead of a device being tested is called "pin electronics." Several copies of the pin electronics, to provide test signals for several leads, are fabricated on one printed circuit board, called a pin electronics card. The test head is generally made up of a card cage in which pin electronics cards are mounted. Adding more pin electronics cards into the test head can increase the number of sites on the test head.

The electrical circuitry inside the test head that generates the signals for one site is connected to a contactor, which makes electrical contact to the leads of the semiconductor device under test.

The test head interfaces to a "handler". The handler presses semiconductor chips into the contactors and removes them after the test. Based on the results of the tests, the handler might also sort the chips by performance grades.

In addition to physically moving the semiconductor chips to the required positions where each chip can make contact with a test site, the handler thermally conditions the chips. Testing is often performed at two or three different temperatures to verify that the chips operate over a range of environmental conditions. One test is usually performed at ambient temperature. Another test is usually performed at an elevated temperature between 105° C. and 165° C. Often, a test is performed at a cold temperature, between 0° C. and −65° C. Usually, the test at ambient temperature is a full functional test of the device under test, meaning that all functions of the chip are tested. The tests at elevated and cold temperature will often not be full functional tests so that the testing process can be faster. The faster tests verify that some subset of the functions of the device still operate at the higher or lower temperature.

Two different strategies have been used for testing parts at multiple temperatures. FIG. 1A shows several test systems, such as 110A and 110B, each operated at different temperatures. Each test system 110 includes a main frame 112 connected to a test head 114. Test head 114 docks to a handler 116. Material handling units, such as 120A, 120B and 120C load and unload semiconductor devices at the handlers 116.

FIG. 1A shows trays 118 used to carry semiconductor components under test. In some instances, the devices under test are carried in tubes or other types of carriers. Inside the handlers 116, the devices under test are queued up in a temperature controlled chamber. Inside this chamber, the parts are brought to the required test temperature before they are plugged into the sockets that connect them to the test head 114. Once the devices are tested at one temperature at test system 110A, a material-handling unit 120B moves the trays 118 to test system 110B for testing at a different temperature.

Material handling units 120A . . . C are shown schematically as wheeled carts. The carts can, for example, be robotic carts, though the semiconductor components can be moved by a person. In addition to a wheeled cart, the material handling system must include elements to move the semiconductor components from the cart to the handler and to perform other device handling operations. The equipment to perform these processes is not expressly shown because it is well known in the art.

An alternative test strategy is shown in FIG. 1B. Test system 150 includes a main frame unit 152 and a test head 154. Distribution unit 162 routes test signals to individual test sites within the thermal chamber 156. In comparison to system 110A and 110B in FIG. 1A, test system 150 includes a much larger thermal chamber 156. More devices are loaded into the thermal chamber 156 at one time. To test at different temperatures, the thermal chamber 156 is loaded with devices. The thermal chamber is then brought to the required temperature, but testing does not begin until the parts have come to thermal equilibrium at the desired temperature.

Distribution unit 162 routes test signals to the parts inside the thermal chamber. In this way, there is not one set of pin electronics for each device in the thermal chamber. Rather, once the devices are brought to thermal equilibrium, devices are tested sequentially.

A test system for functional test of semiconductor memories typically has 16 or fewer sites. Though some test systems have 32 or 64 sites for functional test. Such testers are generally used in a system configured as in FIG. 1A. Some testers, called "burn-in testers", have been made with many sites, such as on the order of one thousand test sites. Such testers are more likely to resemble the system illustrated in FIG. 1B.

A "burn-in tester" usually performs a burn-in test during which the devices under test are thermally stressed by being kept at either an elevated or a low temperature for an extended period of time. During the burn-in test, measurements are made to determine whether the operation of the semiconductor device has gone outside of specifications.

Once the tests at one temperature have been completed, the temperature within the thermal chamber is changed and testing is repeated at a different temperature. A full burn-in test cycle can literally take hours and the approximately 10 minutes it takes to change the temperature inside the burn-in oven is a small fraction of this time.

One disadvantage of the approach of FIG. 1A is that multiple test systems require substantial floor space in the factory making semiconductor devices. Because of the high cost of making a semiconductor fabrication facility, there is a high cost associated with each square foot of floor space occupied by test equipment. Also, there are inefficiencies each time the parts are loaded or unloaded from a test system.

FIG. 1B also suffers from disadvantages. While the floor space occupied by the test system is much smaller, the test time is longer because there is a wait while the parts are brought to the required temperature. For burn-in tests that take hours, this short wait is not significant. However, a delay in testing a part while the temperature changes could be significant percentage of the test times for shorter tests, which could be on the order of a few seconds per part to be tested. In addition, the amount of energy required to change the temperature can be significant.

It would be highly desirable to have an automatic test system that has very high throughput, reduced floor space and reduced power consumption.

SUMMARY OF THE INVENTION

With the foregoing background in mind, it is an object of the invention to provide an automatic test system for testing semiconductor components at multiple temperatures with high throughput.

It is also an object to provide an automatic test system for testing semiconductor components that has small floor space requirements.

It is also an object to provide a test system with reduced power consumption.

The foregoing and other objects are achieved in a test system having a plurality of separate chambers that can be separately controlled. Each chamber interfaces to a test head of a test system. During a test, devices move on trays from one chamber to the next. In a preferred embodiment, each of the test heads is connected to a common tester mainframe.

In another embodiment, the number of sites per test head varies in inverse relationship to the test time at that site.

BRIEF DESCRIPTION OF THE DRAWINGS

The invention will be better understood by reference to the following more detailed description and accompanying drawings in which.

DETAILED DESCRIPTION OF THE INVENTION

Figure 2:
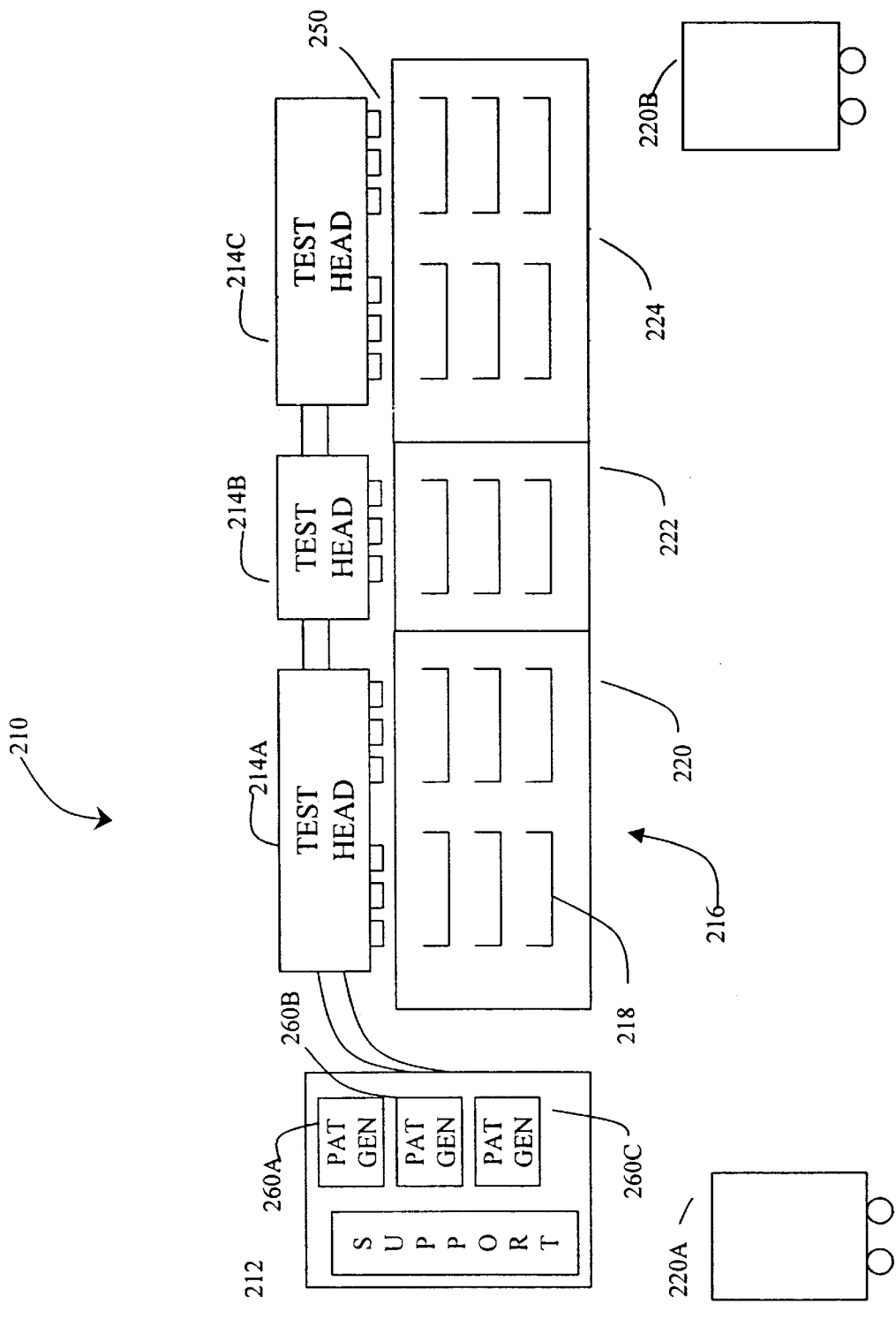
FIG. 2 is a simplified drawing of a test system according to the invention.

Referring now to FIG. 2, a test system according to one embodiment of the present invention includes a multistage handler 216 having a plurality of separate temperature chambers 220, 222 and 224. This multi-chambered construction maximizes test throughput to correspondingly reduce test cost.

In a preferred embodiment, a first temperature chamber 220 comprises a low temperature chamber that can be set to a temperature below 0° C. A second temperature chamber 222 is set to ambient temperature, which is around 25° C. To achieve a relatively high temperature environment for testing, a third temperature chamber 224 is set to a temperature above 105° C.

The test system 210 also includes one test head, 214A, 214B or 214C, for each temperature chamber. Each test head is connected to a tester main frame 212, that provides power, chilled water and other elements that can be shared by multiple test heads.

In a preferred embodiment, the tester main frame 212 includes three pattern generators, 260A, 260B and 260C. Separate pattern generators allow each of the test heads 214A, 214B and 214C to run a separate test at the same time.

Each of the test heads 214A, 214B and 214C has a plurality of contactors 250. The number of contactors is not necessarily the same for each test head. Criteria for selecting the number of contactors for each test head are described below. In a preferred embodiment, each contactor 250 represents one test site. As in the prior art, more sites per test head are provided by adding pin electronics cards to a card cage that forms a test head.

Material handling systems 220A and 220B are shown. Material handling system 220A provides semiconductor devices to be tested. In a preferred embodiment, the devices are provided in trays 218. Typically, the trays are provided in a batch and then loaded one at a time into the handler 216. Once a tray is tested, it is removed from the handler 216 by the material handling system 220B. It is desired that for each tray removed from the handler 216 by the material handler 220B, one tray is added by the material handler 220A. In this way, the trays pass through the handler 216 in a continuous stream.

Figure 3:
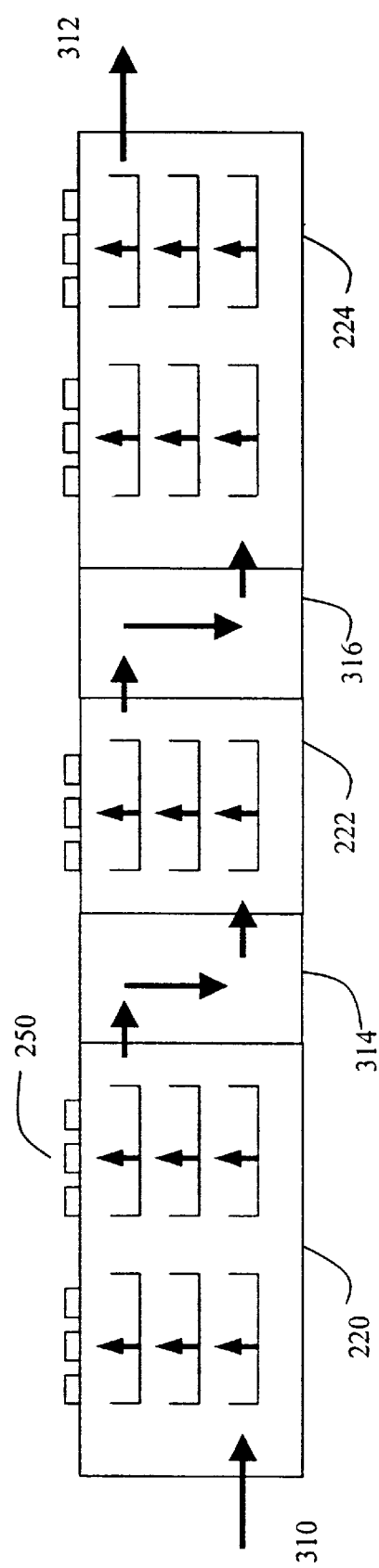
FIG. 3 is a sketch illustrating the flow of trays through the test system of FIG. 2.

FIG. 3 shows the flow of trays 218 through the handler 216. The trays enter at an input area of a transport mechanism 310, and then are queued up in the first temperature chamber 220. As the trays move through the temperature chamber 220, the semiconductor devices in the trays reach the required test temperature.

At the top of the first temperature chamber 220, the devices in the trays 218 are presented to the contactors 250 that are attached to the test head 214A. Testing at a first temperature is then performed at those sites. The devices in a tray are presented to the contactors with a series of pusher assemblies.

Preferably, each tray 218 has numerous platforms, each holding one device. In a preferred embodiment, all of the platforms are held in a frame. The platforms are coupled to the frame through a bearing system that allows each platform to independently move relative to the frame with multiple degrees of freedom. Such a tray is described in U.S. patent application Ser. No. 08/653,588 to Slocum et al., which is hereby incorporated by reference.

Next, the devices pass through a first transport region or chamber 314 and are loaded into the third temperature chamber 222. The trays 218 are passed up through the temperature chamber until they reach the contactors or sites 250 attached to the second test head 214B. As the trays pass through the second temperature chamber 222, the devices in the trays 218 reach thermal equilibrium. At the top of the temperature chamber 222, the devices are plugged into the contactors and tested at a second temperature.

The trays then pass through a second transport region 316 and are loaded into the third temperature chamber 224. The trays pass up through the temperature chamber until the trays reach the top. As the trays pass through the test chamber, the devices again reach thermal equilibrium. At the top of temperature chamber, the devices are inserted into the contactors 250 that are attached to the third test head 214C and tested at a third temperature.

Preferably, the temperatures of the respective chambers 220, 222 and 224 will be set to be monotonically increasing or decreasing. For example, the third chamber 224 will be hotter than the second chamber 222, which will be hotter than the first chamber 220. In this way, less energy is required to heat or cool the chips.

Some handlers include a soak or desoak chamber. These chambers are used when extra time is required to heat or cool the semiconductor devices. Thus, the transport regions 314 or 316 could be heated or cooled, as appropriate, to act as soak or desoak chambers to provide greater control over the temperature of the devices being tested. Often, a desoak chamber is included following the test stage of a handler. This desoak chamber allows the semiconductor devices to reach ambient temperature before they are unloaded from the handler. Thus, though no desoak chamber is shown after temperature chamber 224, one might be included.

One feature of the process flow of FIG. 3 is that some of the temperature chambers include multiple parallel paths of trays. For example, two parallel paths exist in the first temperature chamber 220 and the third temperature chamber 224. In contrast, only one path exists in the second chamber 222. The number of paths can be adjusted based on the length of the test performed in each temperature chamber. Where the test in one chamber takes more time, more devices are tested simultaneously. Preferably, the number of chips tested simultaneously in each temperature chamber varies in proportion to the length of the test in that chamber. In this way, there are no interruptions in the flow of trays from one test chamber to the next.

Preferably, an entire tray of chips is tested at one time. However, it is possible that only a subset of the chips in a tray might be tested simultaneously. For example, the tray can be indexed, by moving it horizontally, to present different subsets of devices in the tray to the contactors 250.

The transport mechanism 310 for moving the trays through each temperature chamber is well known in the art and warrants no further disclosure. The specific mechanical elements are not critical to the invention. However, examples of suitable elements for moving trays vertically through the test chamber include auger-like screws. An alternative would be a mechanical indexing system having a set number of positions.

If transport chambers 314 and 316 are configured as presoak or desoak chambers, then similar mechanical systems might be used to move trays through those chambers. If a long dwell time in those chambers is not required, a mechanical arm might be used. For example, an arm would remove trays from the test station in the first temperature chamber 220 and then rotate the tray into the first transport chamber 314. The arm would then slide down a shaft in the transport chamber 314 and rotate the tray into the second temperature chamber 222.

Many variations on the design of such an arm might be possible. For example, rather than sliding down a shaft, the arm might be mounted on a telescoping shaft. As another example, rather than rotating, the arm might have an extending portion which could be extended to pick up and put down trays.

For purposes of clarity, it will be appreciated that no specific devices are shown to control the temperature of the temperature chambers or the speed at which parts move through the temperature chambers. Such devices are within the state of the art.

Figure 1A:
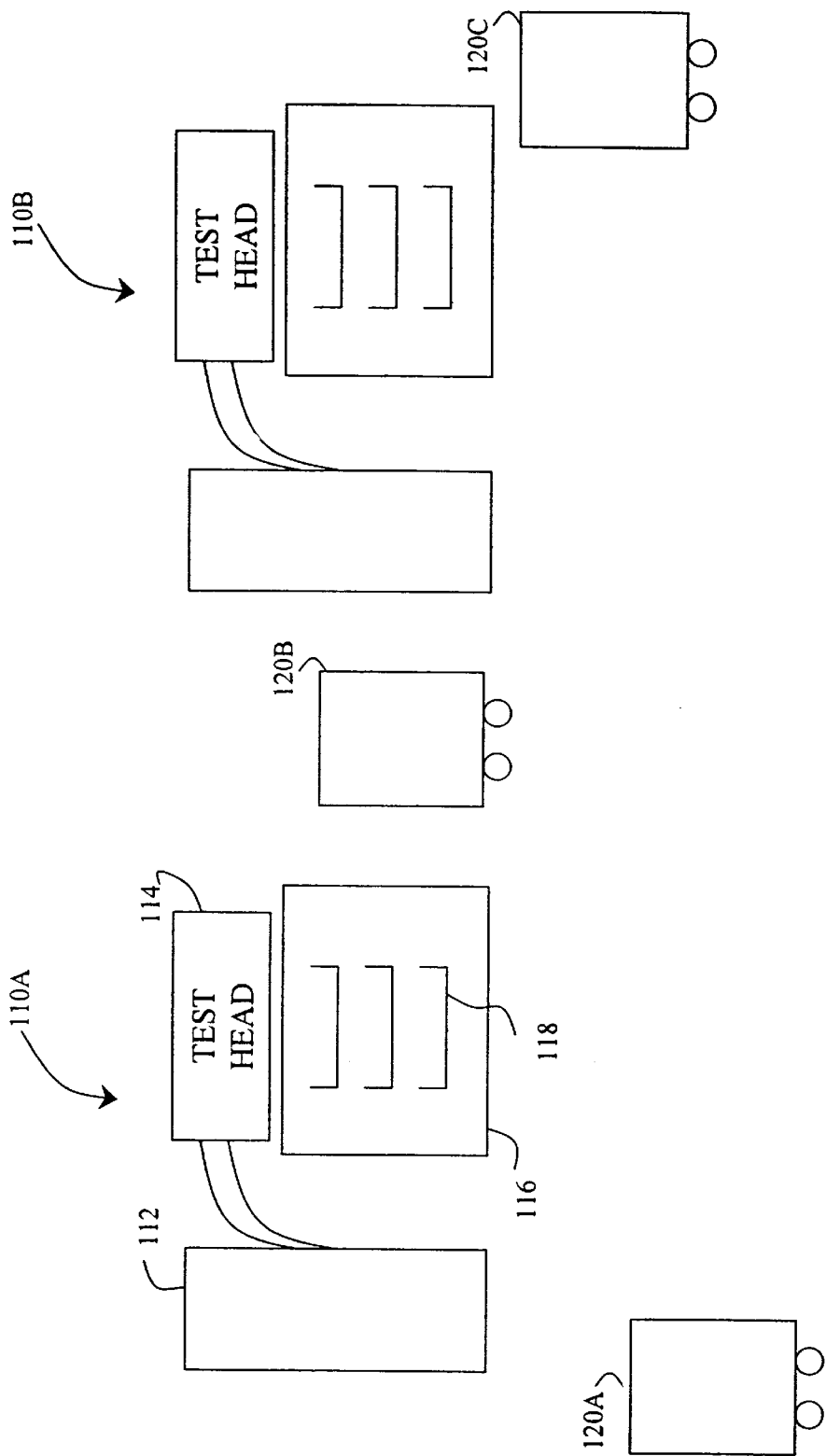
FIG. 1A is a simplified drawing of a prior art test system.
Figure 1B:
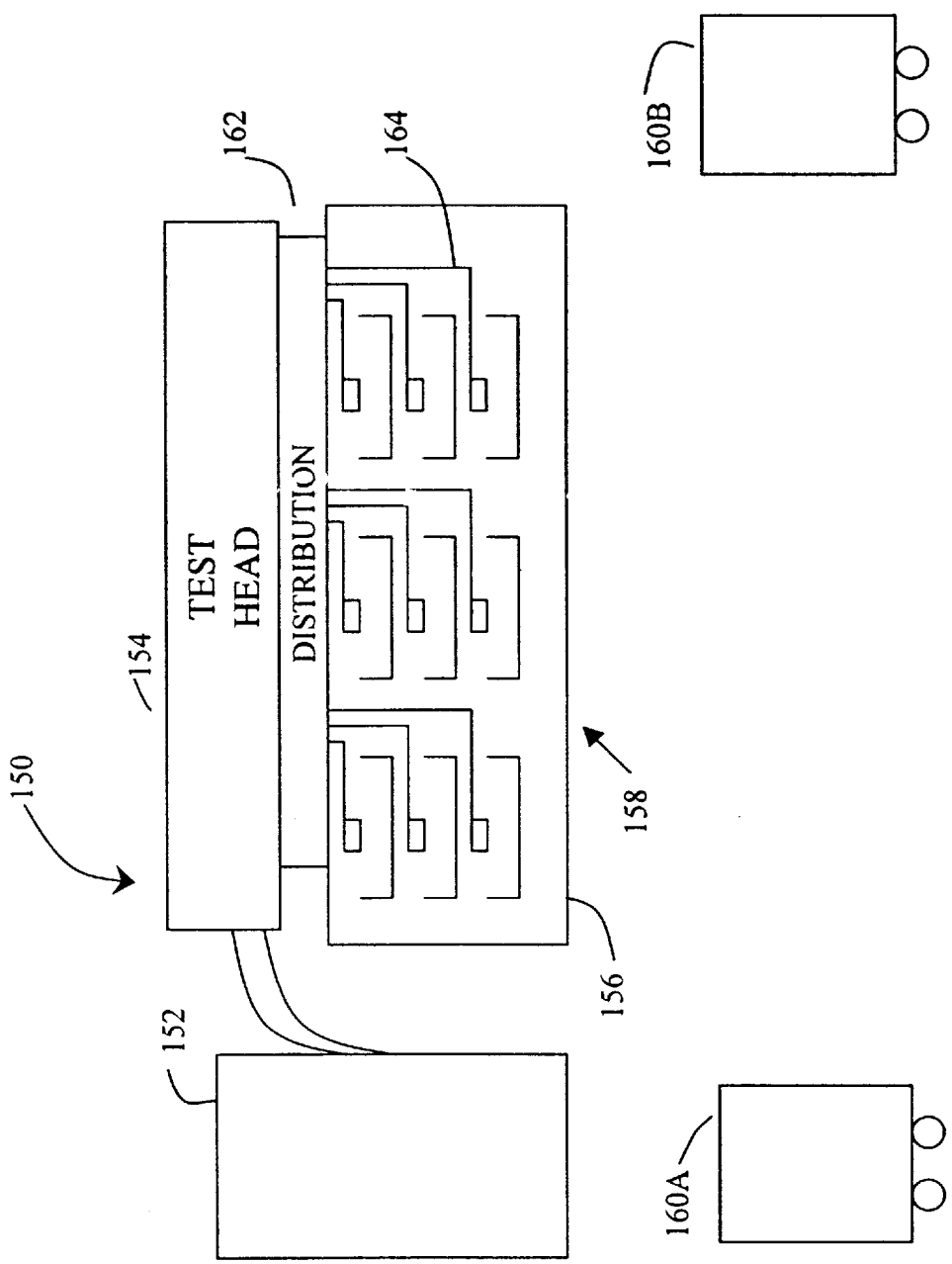
FIG. 1B is a simplified drawing of a second prior art test system.

There are several advantages associated with the test system as described above. First, the utilization of the test system is very high. Approximately 60% of the cost of an automatic test system is the pin electronics. If parts must be functionally tested at multiple temperatures in a test system such as FIG. 1B, very poor utilization of the pin electronics results. For example, a test of a tray of parts might take 5 minutes. If it takes 8 minutes for the parts to reach thermal equilibrium between changes in temperature, resulting in a utilization of around 40%. Low utilization of equipment in a manufacturing process is undesirable because it raises the cost of the process.

A second advantage is that handling steps have been eliminated. There is no need to load and unload separate handlers, as would occur with the system of FIG. 1A. Handling equipment is expensive and takes up space in a semiconductor manufacturing plant. It can also slow down the processing of devices, which results in lower throughput.

Further, the amount of equipment is reduced. Common support circuitry for all three test heads means that the space occupied by the tester mainframe is less than the total space needed for separate tester main frames for each test head.

Having described one embodiment, numerous alternative embodiments or variations might be made. For example, the number of temperature chambers might be more or less than illustrated.

Also, it is illustrated that trays of semiconductor devices are tested while in the respective temperature chambers 220, 222 and 224. However, it is possible that the devices will be tested in test chambers which are thermally isolated from the chambers in which they are placed while reaching a desired temperature. This technique has been used in prior handlers, in which separate test chambers and "soak" chambers are used. Separate chambers are used because the contactors, being connected to a test head outside the thermal chamber, often have a relatively large thermal mass. When semiconductor devices are plugged into the contactors, their temperature might change. To avoid that problem, additional heating or cooling is often provided in the test chamber.

In addition, it should be noted that the trays are illustrated as moving through the temperature chambers vertically. Other mechanical handling schemes could be used. For example, the trays might move horizontally, such as on a moving belt. Or, some combination of horizontal and vertical motion might be used.

Another possible variation relates to the way in which the flow of trays through the temperature chambers, such as 220, 222 and 224, is balanced. For example, some of the temperature chambers are shown to have multiple paths of trays, which increases the rate at which the trays can be moved through those temperature chambers while still allowing the semiconductor devices in those trays to reach thermal equilibrium before being tested. Other structures might be used to achieve the same purpose. For example, rather than having multiple tray paths to increase throughput, a single tray path might be used, but the speed might be increased. That chamber might need to be longer so that, even though the trays moved faster through the chamber, they reached thermal equilibrium before reaching the test sites. Some combination of multiple paths and variable speed might be used to make the throughput through each temperature chamber equal. It is possible that the handler 216 will be programmable such that the speed at which trays or devices moves through each temperature chamber could be independently controlled.

Also it was described that devices were plugged into contactors one tray at a time for simultaneous testing. However, it should be noted that testing other than a full tray of devices at one time can lead to greater control in matching the throughput of testing at each temperature. For example, if the testing in the first temperature chamber 220 takes four times as long as the testing in the second temperature chamber 222, the second test head 214B might be equipped with test sites to test only one half of a tray of devices at one time. The first test head 214A would then be equipped to test two full trays of devices at one time.

Further, it is not necessary that semiconductor devices be carried on trays. While that is the preferred embodiment, it would be possible to match the throughput through each temperature chamber using other techniques for moving the devices. For example, the devices might be loaded into the handler in tubes and then slid along rails within the handling device.

Also, it should be appreciated that, while FIG. 2 shows physically separate test heads, it is not necessary that the separate test heads be in separate card cages or other mechanical support structures. It is, however, desirable, that there be logically separate test heads. Logically separate test heads can be provided by sets of pin electronics that can be separately controlled to run different tests on parts in different thermal chambers simultaneously.

Therefore, the invention should be limited only by the spirit and scope of the appended claims.

What is claimed is:

1. A test system for semiconductor chips having:
   a) a plurality of independently controllable test heads for generating respective sets of test signals;
   b) a handler having a plurality of interconnected temperature chambers corresponding to said plurality of test heads, each of said temperature chambers including
      a set of contactors connected to a corresponding test head and adapted to couple to a stream of semiconductor devices moving through said temperature chamber.

2. The test system of claim 1 wherein each temperature chamber includes a series of trays adapted for carrying said semiconductor chips to define said stream of semiconductor chips.

3. The test system of claim 2 wherein each temperature chamber includes a plurality of series of trays, each of said series of trays running in parallel paths.

4. The test system of claim 2 wherein at least one of the temperature chambers contains a single series of trays.

5. The test system of claim 2 wherein each tray is adapted to carry between 16 and 64 semiconductor chips.

6. The test system of claim 1 wherein said plurality of temperature chambers comprises at least a first chamber controlled to have a temperature below 0° C and a second temperature chamber having a temperature above 105° C.

7. The test system of claim 1 additionally comprising a tester mainframe comprising:
   a) a plurality of pattern generators, each generator being connected to one of said test heads; and
   b) support circuitry connected to all of said plurality of test heads.

8. A test system for semiconductor chips having:
   a) a plurality of independently controllable test heads for generating respective sets of test signals;
   b) a handler having a plurality of interconnected temperature chambers corresponding to said plurality of test heads, each of said temperature chambers including
      a set of contactors connected to a corresponding test head and adapted to couple to a stream of semiconductor chips moving through said temperature chamber; and
   c) a tester mainframe comprising
      a plurality of independently controlled pattern generators, each generator being connected to one of said test heads, and
      support circuitry connected to all of said plurality of test heads.

9. The test system of claim 8 wherein said support circuitry comprises a chilled water source.

10. The test system of claim 8 wherein said plurality of temperature chambers comprises a first temperature chamber controlled to have a temperature below 0° C. and a second temperature chamber having a temperature above 105° C.

* * * * *